United States Patent [19]
Schommer et al.

[11] Patent Number: 5,933,007
[45] Date of Patent: Aug. 3, 1999

[54] MR DEVICE FOR DETERMINING A NUCLEAR MAGNETIZATION DISTRIBUTION BY MEANS OF A SURFACE COIL SYSTEM

[75] Inventors: Jan Schommer; Christoph Leussler, both of Hamburg, Germany

[73] Assignee: U.S. Philips Corporation, New York, N.Y.

[21] Appl. No.: 08/836,866

[22] PCT Filed: Sep. 19, 1996

[86] PCT No.: PCT/IB96/00963

§ 371 Date: May 21, 1997

§ 102(e) Date: May 21, 1997

[87] PCT Pub. No.: WO97/11382

PCT Pub. Date: Mar. 27, 1997

[30] Foreign Application Priority Data

Sep. 22, 1995 [DE] Germany ............................ 195 35 257

[51] Int. Cl.[6] ....................................................... G01V 3/00
[52] U.S. Cl. ................................................................ 324/318
[58] Field of Search .................................... 324/318, 322, 324/314, 300, 307, 309

[56] References Cited

U.S. PATENT DOCUMENTS 5,309,104  5/1994  Fredrick .................................. 324/318
5,552,707  9/1996  Takahashi et al. ..................... 324/318
5,564,421  10/1996  Ehnholm ................................. 324/318
5,602,479  2/1997  Srinivasan et al. ..................... 324/318
5,602,557  2/1997  Duerr ...................................... 324/318

OTHER PUBLICATIONS

"The NMR Phased Array", Magnetic Resonance In Medicine 16, 192–225 (1990), P.B. Roemer, W.A. Edelstein, C.E. Hayes, S.P. Souza, O.M. Mueller.

"An 8–Element Cortical Top Head Coil Array", 2nd SMR, Philips Research, Department Technical Systems, Hamburg Germany, C. Leussler, p. 1103, 1994.

Primary Examiner—Louis Arana
Attorney, Agent, or Firm—Dwight H. Renfrew, Jr.

[57] ABSTRACT

An MR device for determining the nuclear magnetization distribution in an examination zone by means of a surface coil system includes a plurality of coils, preferably ranging from six to twenty-four in number, which are located at different angular positions and are constructed as respective loops, a part of the loops being bent towards the interior of the surface coil system. The coils are arranged on a straight circular support and each of the coils partly overlaps the loop of the neighboring coils. An MR device including such angular coils enables substantially stronger MR signals to be received from an examination zone. This MR device is particularly suitable for use as a head coil system for examinations of the head.

20 Claims, 3 Drawing Sheets

MR DEVICE FOR DETERMINING A NUCLEAR MAGNETIZATION DISTRIBUTION BY MEANS OF A SURFACE COIL SYSTEM

BACKGROUND OF THE INVENTION

1. Field of the Invention

The invention relates to an MR device for determining the nuclear magnetization distribution in an examination zone by means of a cylindrical surface coil system which includes at least two coils which are constructed as respective loops. The invention also relates to a head coil system with a surface coil system which includes at least two coils which are constructed as respective loops.

2. Description of Related Art

The determination of the nuclear magnetization distribution in an examination zone by means of a surface coil system consisting of at least two surface coils offers the advantage that the signal-to-noise ratio is significantly enhanced in comparison with coils receiving spin resonance signals from the entire examination zone. A surface coil system is known from Magnetic Resonance in Medicine 16, pp. 192–225, 1990. Therein, the images of the individual surface coils are combined so as to form an overall image by means of an appropriate method. It is a drawback of a surface coil system that its sensitivity is locally not uniform, i.e. that it is dependent on where in the examination zone the MR signal occurs.

A head coil system is known from 2nd SMR, Book of Abstracts, page 1103, 1994. Therein, a coil system which consists of six elements and can be wrapped around the head is supplemented by a butterfly coil which consists of two elements and is arranged on the skullcap of the patient. It is thus achieved that MR signals are also received from the area of the top of the head, but the sensitivity of the two butterfly elements is not very uniform so that problems are encountered when the individual images are combined so as to form an overall image. Moreover, two further receiving channels are required for the two butterfly elements.

SUMMARY OF THE INVENTION

It is an object of the present invention to enhance such an MR device in respect of sensitivity and resolution while using simple means. It is also an object of the invention to improve a head coil system of the kind set forth.

The former object is achieved according to the invention in that the coils are angular coils, part of the loop of which is bent towards the interior of the surface coil system.

The invention is based on the recognition of the fact that stronger MR signals can be received from an examination zone if the receiving coils are situated as near as possible to the object to be examined and cover an as large as possible part of the surface of this object.

The angular coils in the MR device according to the invention are bent so that they are situated as near as possible to the surface of the object to be examined. It is notably in the case of an MR device for examining the head, that the bent parts of the loops are situated directly over the top of the head. It is thus achieved that, in comparison with the known devices, substantially stronger MR signals can also be received from the upper area of the head. It is a particular advantage of the MR device according to the invention that no additional receiving channels are required, because the number of coils of the surface coil system can remain the same. It is merely that the coils are constructed as angular coils.

In a further embodiment of the invention the bent part of the loop is bent towards the interior of the surface coil system at an angle of no more than 90°. When the loop parts are bent exactly through 90°, the MR device is particularly suitable for use as a head coil system. Thus, according to the invention the bent parts of the loops are situated in a common plane, resulting in a substantial enhancement of the homogeneity of the receiving profile of the MR device.

The angle coils in an embodiment of the invention are arranged on a coil support which is constructed as a straight circular cylinder. A particularly uniform receiving profile is thus also achieved within the cylinder, so that the MR device is particularly suitable for examination of the head.

In order to minimize the mutual coupling of the coils of the surface coil system, neighboring coils of the surface coil system partly overlap in an embodiment of the invention. An overlap width can be found for which the coupling between two neighboring coils is minimum. The loops of the coils are then constructed so that at the points of intersection of two coils the loops intersect at right angles, the loops being separated from one another at the points of intersection by insulating plates.

For further improvement of the signal-to-noise ratio, at least one capacitor is inserted in the loop of a coil of the surface coil system in a further embodiment of the invention. The capacitor and the coil then form a resonant circuit which can be tuned to the Larmor frequency by a suitable choice of the value of the capacitor.

In a particularly attractive embodiment of the invention a gradient coil system and/or a transmitter coil system is integrated in the surface coil system. Substantially higher transmission field strengths can thus be produced in the object to be examined, for example the head; this is particularly advantageous for angiography methods. fn comparison with a system comprising conventional body coils, being situated substantially further from the head, a significant improvement of the resolution can thus be achieved.

The object to improve a head coil system comprising at least two coils constructed as respective loops is achieved according to the invention in that the coils are angular coils, part of the loop of which is bent towards the interior of the surface coil system. A first part of the loop then encloses a surface area which is situated in a first plane and a second part of the loop encloses a surface area which is situated in a second plane which extends at an angle with respect to the first plane.

A particularly uniform receiving profile and a high signal-to-noise ratio are achieved in embodiments in which the first and the second plane intersect at an angle of 90° and the coils are cylindrically arranged in such a manner that the second planes form a common plane.

BRIEF DESCRIPTION OF THE DRAWINGS

The invention will be described in detail hereinafter with reference to the drawing. Therein.

DETAILED DESCRIPTION OF THE PREFERRED EMBODIMENTS

Figure 1:
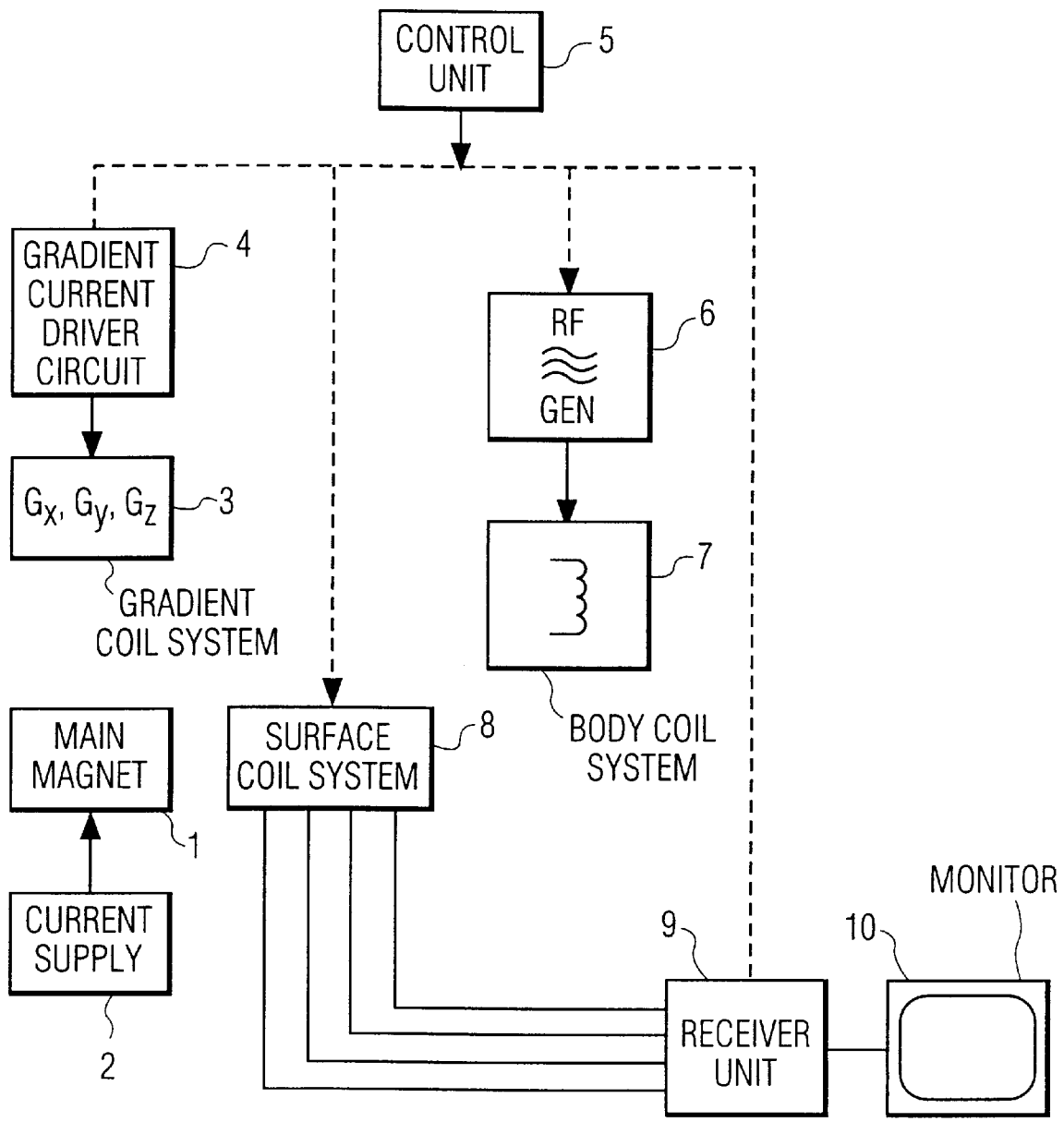
FIG. 1 shows a block diagram of an MR examination apparatus in which the invention can be implemented.

The reference numeral 1 in the block diagram of FIG. 1 denotes a preferably superconducting main magnet which generates a steady, uniform magnetic field in an examination zone in which a patient can be arranged. The current required for this purpose is supplied by a unit 2. The reference numeral 3 denotes a gradient coil system which is capable of generating a magnetic gradient field which extends in the direction of the steady magnetic field and whose gradient extends either in the same direction or in two directions which are perpendicular thereto and perpendicular to one another. The currents required for this purpose are supplied by a driver circuit 4, the variation in time of the currents being controlled by a control unit 5 which can be implemented by means of a suitably programmed processor.

There is also provided an RF generator 6 which is capable of generating pulsed oscillations of the Larmor frequency of the type of atom whose nuclear magnetization is to be determined. The RF generator 6 is connected to a body coil system 7 which has a conventional cylindrical shape and encloses the body of the patient over a given length during the MR examination in order to generate an essentially uniform RF magnetic field within the patient.

Also provided is a surface coil system 8 which consists of a plurality of surface coils. The surface coil system 8 is connected to a receiver unit 9, the receiver unit 9 comprising a respective channel for each coil of the surface coil system 8, the MR signal received by the relevant coil being amplified, transposed to a lower frequency range and digitized in said channel, after which a respective MR image can be reconstructed from the digitized MR signals. The MR images formed in the receiving and processing unit 9 can be displayed on a monitor 10.

The units 4, 6, 8, 9 are controlled by the control unit 5. In the transmission mode the oscillations produced by the RF generator 6 are applied to the body coil system 7 which generates an RF magnetic field in the examination zone. The surface coil system 8 is not active in the transmission mode, for example in that each individual coil of this system is detuned in the transmission mode. The MR signals arising in the examination zone in the receiving mode are received by the surface coil system 8. The body coil system 7 is then detuned. As a result, these coil systems are inductively decoupled from one another.

Figure 2:
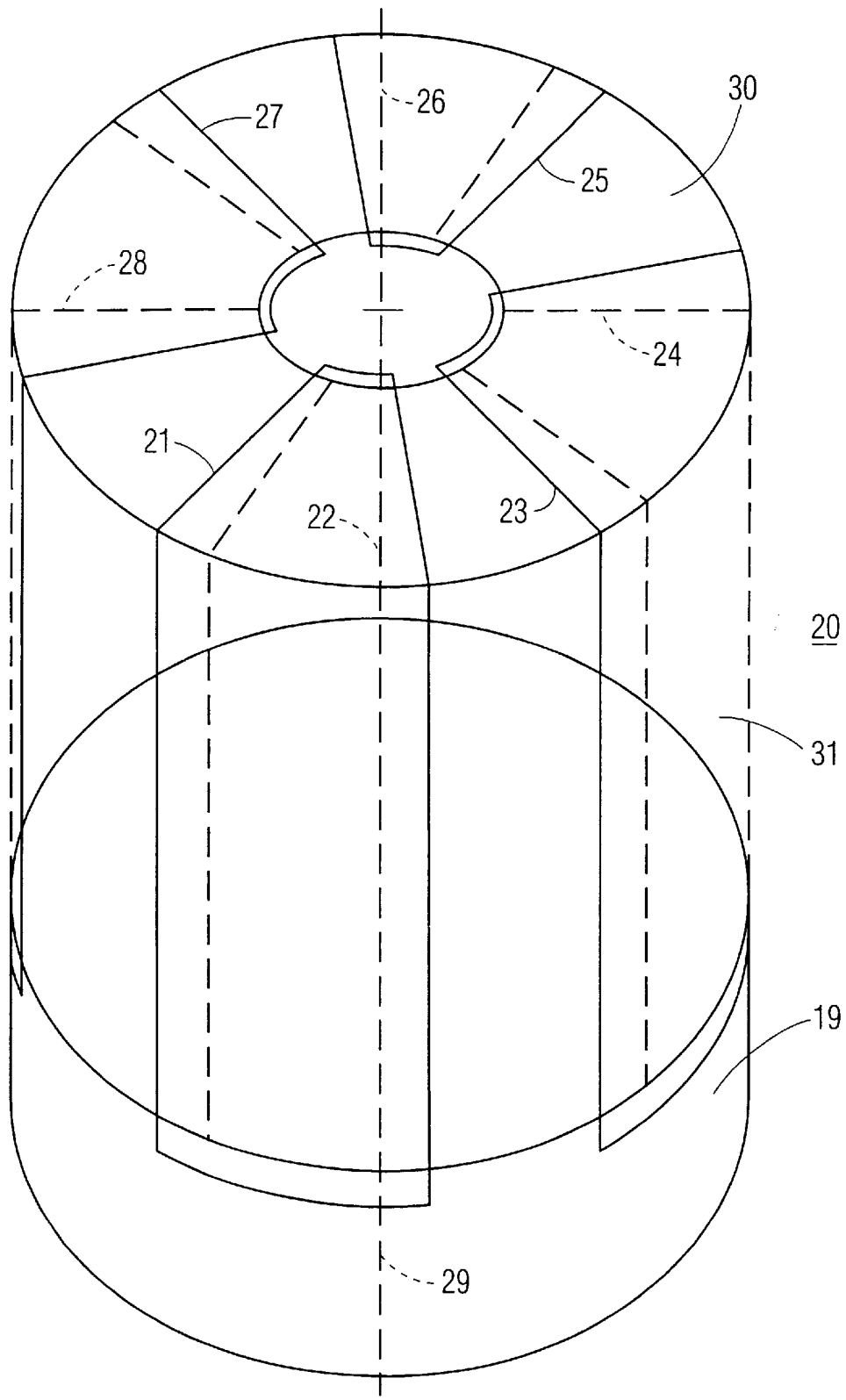
FIG. 2 shows a head coil system with eight angular coils.

FIG. 2 shows a surface coil system 20 with eight angular coils 21 to 28. The angular coils 21 to 28 are provided on a cylindrical coil support 19 which is made of a non-conductive material, for example plexiglass. The angular coils 21 to 28 and the coil support 19 are proportioned so that this surface coil system 20 is suitable for use as a head coil system. The head of a patient is situated within and circularly inclosed by the cylindrical coil support and the eight angular coils 19 and the eight angular coils during an examination.

Each of the eight angular coils 21 to 28 is constructed as a closed loop of a conductive material. The upper part of each loop in the Figure is bent 90° towards the cylinder axis 29, i.e. towards the interior area of the surface coil system 20. The parts of the loops of the angular coils 21 to 28 thus bent are all situated in the same plane 30 which corresponds to the upper end plane of the cylindrical coil support 19.

This system is substantially more sensitive to signals to be measured in the upper area of the cylindrical system 20. In comparison with the known device, in which the coils are provided as closed loops only on the exterior 31 of the cylinder and do not comprise a bent part, a substantially enhanced signal-to-noise ratio is achieved. The individual images measured by the individual angular coils 21 to 28 are combined, using a known method, such as the sum of squares method, so as to form an overall image having a substantially improved resolution.

Each of the angular coils 21 to 28 partly overlaps the loops of the two neighboring angular coils. The magnetic coupling of two neighboring angular coils can thus be minimized; an ideal overlap width can then be found for which the magnetic coupling is minimum.

Figure 3:
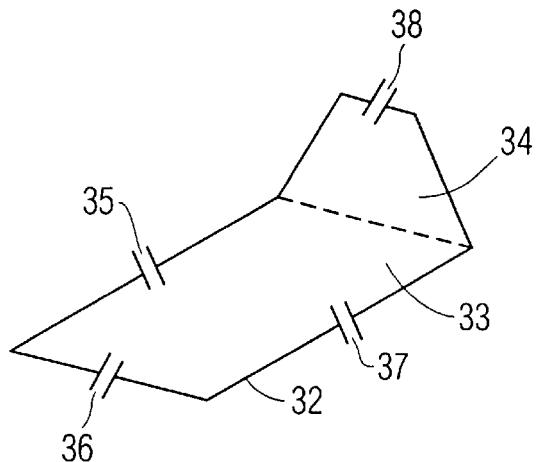
FIG. 3 shows an angular coil according to the invention in which capacitors are inserted.

FIG. 3 shows a single angular coil 32 according to the invention. It can be seen that the planes in which the surface area 33, enclosed by a first part of the loop, and the surface area 34, enclosed by the second part of the loop, intersect one another at an angle of 90° along the dashed line 41. The angle is measured between the line 42, i.e. an imaginary continuation of the loop part enclosing the surface area 33, and the surface area 34. Four capacitors 35 to 38 are connected in the loop 32. As a result, the loop constitutes a resonant circuit in conjunction with the capacitors and can be tuned to the Larmor frequency of the atoms to be measured, so that the signal-to-noise ratio can be improved.

The coil may be made of metal or another conductive material, for example a conductive synthetic material or a conductive lacquer. The coils may be constructed as a tubular conductor or be provided directly on the coil support as a one-layer or multi-layer etched multi-layer material. In a practical embodiment the coils consist of copper strips which have a width of 10 mm and a thickness of 0.2 mm, and are glued directly onto a plexiglass cylinder.

Figure 4:
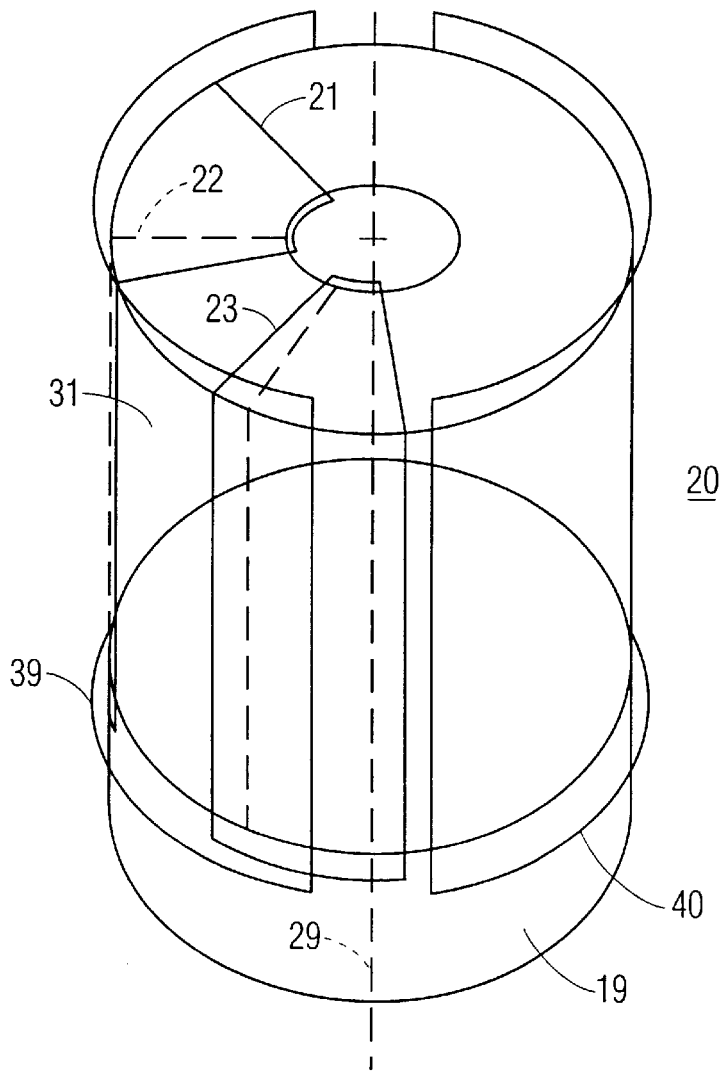
FIG. 4 shows a head coil system with an integrated transmitter coil system.

FIG. 4 shows the surface coil system 20 of FIG. 2, be it with only three angular coils 21, 22, 23 for the sake of clarity. A transmitter coil system, consisting of two saddle coils 39, 40, is integrated in the surface coil system 20. The saddle coils 39, 40 also extend on the external surface 31 of the cylindrical coil support 19, but may also be situated slightly further from the cylinder axis 29. Using such a transmitter coil system, a substantially higher transmission field and hence a higher resolution can be achieved in comparison with a whole body-transmitter coil system.

The Figures do not show an embodiment in which a gradient coil system is integrated in the surface coil system 20. However, such integration could be realized in the same way as the integration of the transmitter coil system shown in FIG. 4. The resolution can thus be substantially improved again in comparison with an MR device comprising a conventional gradient coil system.

The angular coils used may also have a shape other than that shown in the FIGS. 2 to 4, for example an elliptical shape. Moreover, the dimensions of the angular coils used in a surface coil system may also differ. In a practical embodiment of a head coil system, the coils situated in front of the patient's face are constructed to be slightly larger and are situated further from the surface of the head than the coils situated at the back of the head. Moreover, directly in front of the field of vision of the patient the coil support is provided with a slit; in order to reduce the patient's feeling of being tightly enclosed by the head coil system, no coil is provided at the area of the slit.

In order to offer the surgeon free access, for example for operations from the top of the head, the head coil system can be constructed so as to have a removable upper part with the bent loop parts, so that the remainder of the head coil system does not have bent coils. In order to enable measurements to be performed when said upper part is removed, a ring-like part without bent loop parts is then placed on said remainder of the head coil system.

The outputs of the individual angular coils are connected to a transformation circuit which transforms the resistance of the coil to the optimum noise resistance of the input transistor of the preamplifier. In order to reduce the number of receiving channels of the MR device, the outputs of two preamplifiers, each associated with a respective coil, can be combined, focusing to a given tissue depth in the object to be examined then being possible by means of a phase shifter connected downstream from one of the two preamplifier outputs.

The number of angular coils used is not an essential aspect of the invention. Moreover, the bent part need not be bent through 90°; it would also be feasible to use a different angle, for example 60° or 45°. It is also feasible to use a surface coil system comprising alternately an angular coil and a coil without a bent part.

In comparison with the known device, the MR device according to the invention achieves a substantially higher resolution and more uniform sensitivity across a larger area. The head coil system according to the invention is notably suitable for forming MR images of the complete head with a uniformly high resolution throughout the examination zone. If the head coil system is expanded so as to form a chest and/or neck coil system whose individual images are also taken into account for the formation of the overall image, images can be formed from the top of the head down to the fifth thoracic vertebra.

We claim:

1. A surface coil system for determining the nuclear magnetization distribution in an examination zone of an MR device comprising
   a coil support adapted to circularly enclose the examination zone, and
   a plurality of surface coils positioned at different angular positions entirely around the coil support, wherein the surface coils are constructed as respective loops, one or more of the loops having a part which is bent towards the interior of the coil support, and wherein each surface coil partially overlaps its two neighboring surface coils around the coil support.

2. An MR device as claimed in claim 1, wherein the bent part of the loop is bent towards the interior of the surface coil system at an angle of no more than 90°.

3. An MR device as claimed in claim 2, wherein the coil support is constructed as a straight circular cylinder.

4. An MR device as claimed in claim 2, wherein the plurality of coils range from six to twenty-four in number.

5. An MR device as claimed in claim 2, wherein the bent parts of the loops are situated in a common plane.

6. An MR device as claimed in claim 5, wherein the coil support is constructed as a straight circular cylinder.

7. An MR device as claimed in claim 5, wherein the plurality of coils range from six to twenty-four in number.

8. An MR device as claimed in claim 1, wherein the coil support is constructed as a straight circular cylinder.

9. An MR device as claimed in claim 8, wherein the plurality of coils range from six to twenty-four in number.

10. An MR device as claimed in claim 1, wherein the plurality of coils range from six to twenty-four in number.

11. An MR device as claimed in claim 1, wherein at least one capacitor is inserted in the loop of at least one of said coils.

12. An MR device as claimed in claim 1, further comprising a gradient coil system and/or a transmitter coil system integrated in the surface coil system.

13. The system of claim 1 wherein the partial overlap of neighboring surface coils is such that magnetic coupling between neighboring surface coils is minimized.

14. The system of claim 1 wherein alternate surface coils have a part which is bent towards the interior of the coil support.

15. The system of claim 1 wherein all surface coils have a part which is bent towards the interior of the coil support.

16. The system of claim 15 wherein the coil support is additionally adapted and proportioned to circularly enclose both a head, a neck, and a chest when arranged in the examination zone.

17. A surface coil system for determining the nuclear magnetization distribution in a head of a patient arranged in an examination zone of an MR device comprising:
   a coil support adapted and proportioned to circularly enclose a head when arranged in the examination zone, and
   a plurality of surface coils positioned at different angular positions entirely around the coil support, wherein the surface coils are constructed as respective loops, one or more of the loops having a part which is bent towards the interior of the coil support, and wherein each surface coil partially overlaps its two neighboring surface coils around the coil support.

18. The system of claim 17 wherein the surface coils to be situated in front of the head are larger and positioned farther from the head than are the surface coils to be situated at the sides and back of the head.

19. The system of claim 17 wherein the coil support is additionally adapted and proportioned to circularly enclose both a head and a neck of a patient when arranged in the examination zone.

20. The system of claim 17 wherein all surface coils have a part which is bent towards the interior of the coil support.

* * * * *